(12) United States Patent
James et al.

(10) Patent No.: US 7,185,141 B1
(45) Date of Patent: Feb. 27, 2007

(54) APPARATUS AND METHOD FOR ASSOCIATING INFORMATION VALUES WITH PORTIONS OF A CONTENT ADDRESSABLE MEMORY (CAM) DEVICE

(75) Inventors: David V. James, Palo Alto, CA (US); Jagadeesan Rajamanickam, San Jose, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 298 days.

(21) Appl. No.: 10/271,660

(22) Filed: Oct. 16, 2002

Related U.S. Application Data

(60) Provisional application No. 60/343,973, filed on Dec. 27, 2001.

(51) Int. Cl.
*G06F 12/00* (2006.01)
(52) U.S. Cl. ...................... 711/108; 711/101
(58) Field of Classification Search ............... 711/108, 711/151, 158, 167; 365/49
See application file for complete search history.

(56) References Cited

U.S. PATENT DOCUMENTS

| | | | |
|---|---|---|---|
| 4,244,033 A | 1/1981 | Hattori | |
| 5,440,715 A * | 8/1995 | Wyland | 711/108 |
| 5,537,623 A * | 7/1996 | Chamberlain et al. | 709/220 |
| 5,734,819 A | 3/1998 | Lewis | |
| 5,893,137 A * | 4/1999 | Parks et al. | 711/108 |
| 5,920,886 A | 7/1999 | Feldmeier | |
| 5,946,704 A | 8/1999 | Yoneda et al. | |
| 6,191,970 B1 | 2/2001 | Pereira et al. | |
| 6,243,280 B1 | 6/2001 | Wong et al. | |
| 6,345,345 B1 | 2/2002 | Yu et al. | |
| 6,430,074 B1 | 8/2002 | Srinivasan | |
| 6,538,911 B1 * | 3/2003 | Allan et al. | 365/49 |
| 6,542,391 B2 * | 4/2003 | Pereira et al. | 365/49 |
| 6,588,006 B1 * | 7/2003 | Watkins | 716/13 |
| 6,760,242 B1 | 7/2004 | Park et al. | |
| 6,765,408 B2 * | 7/2004 | Cheng et al. | 326/41 |
| 6,804,132 B2 * | 10/2004 | Andersen et al. | 365/49 |
| 6,853,640 B1 * | 2/2005 | Hayashi et al. | 370/392 |
| 6,859,378 B1 * | 2/2005 | Lin et al. | 365/49 |
| 6,910,097 B1 | 6/2005 | Srinivasan et al. | |
| 6,937,491 B2 * | 8/2005 | Park et al. | 365/49 |

* cited by examiner

*Primary Examiner*—T Nguyen
(74) *Attorney, Agent, or Firm*—Bradley T. Sako

(57) ABSTRACT

According to one embodiment, a content addressable memory (CAM) device (100) may include a number of CAM entry sets (102-0 and 102-1), each of which includes multiple CAM entries. CAM (100) may also include multiple programmable information registers (PIRs) (104-0 and 104-1), each of which can be associated with a CAM entry set (102-0 and 102-1). PIRs (104-0 and 104-1) may be accessed in response to CAM commands. Values stores in PIRs (104-0 and 104-1) may control access to associated CAM entry sets (102-0 and 102-1) and/or be output in response to predetermined operations in an associated CAM entry set (102-0 and 102-1).

19 Claims, 11 Drawing Sheets

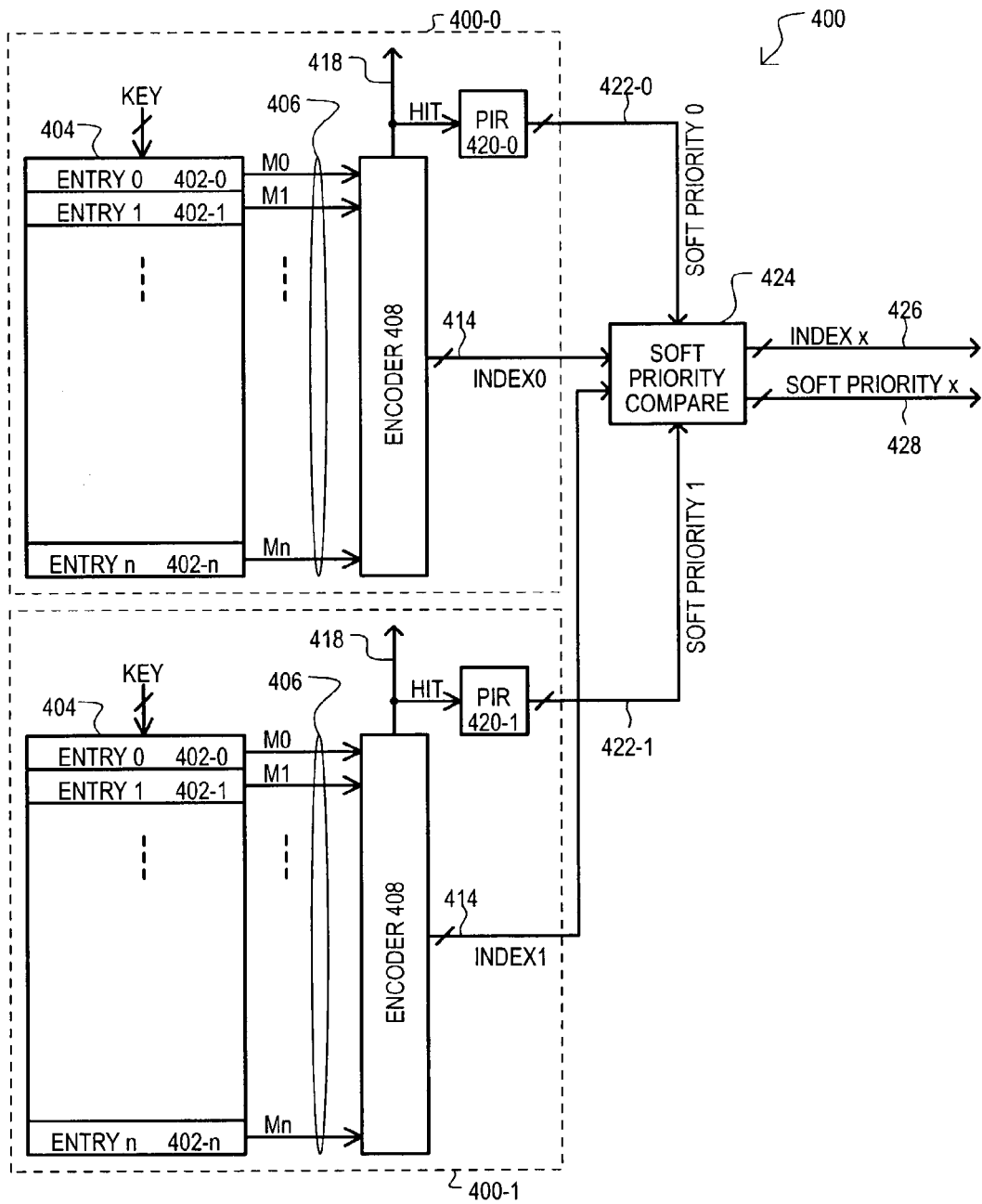

APPARATUS AND METHOD FOR ASSOCIATING INFORMATION VALUES WITH PORTIONS OF A CONTENT ADDRESSABLE MEMORY (CAM) DEVICE

This application claims the benefit of provisional application Ser. No. 60/343,913 filed Dec. 27, 2001.

TECHNICAL FIELD

The present invention relates to content addressable memory (CAM) devices and particularly to CAM devices having entries that may be divided into portions that each include a number of CAM entries.

BACKGROUND OF THE INVENTION

Due to the increasing need for rapid matching capabilities, content addressable memories (CAMs) continue to proliferate. A CAM may perform matching functions by applying a search key or "comparand" to a table of stored data values. A CAM may then determine if any of the data values match a given search key.

CAM devices may take a variety of forms. As but a few of the possible examples, some CAM devices are based on particular types of CAM cells. Such cells may include storage circuits integrated with compare circuits. Examples of storage circuits may be static random access memory (SRAM) type cells or dynamic RAM (DRAM) type cells. Alternate approaches may include RAM arrays, or the like, with separate matching circuits and/or processes.

Referring now to FIG. 9, a conventional CAM device is set forth in a block diagram and designated by the general reference character 900. A conventional CAM device 900 may include a number of entries (ENTRY0 to ENTRYn) 902 and a priority encoder 904. Each entry (ENTRY0 to ENTRYn) may store a data value for comparison with an applied key value KEY. In a conventional compare operation, a key value KEY can be applied to entries (ENTRY0 to ENTRYn) essentially simultaneously. That is, a key value KEY can be applied to all entries (ENTRY0 to ENTRYn).

Each entry (ENTRY0 to ENTRYn) can generate a corresponding match indication (MATCH0 to MATCHn) that can reflect whether or not data for an entry matches an applied key value. More a particularly, if entry data matches a key value, a corresponding match indication can be active. If entry data does not match a key value, a corresponding match indication can be inactive.

Priority from among multiple active match indications can be established by a priority encoder 904. More particularly, a conventional priority encoder 904 can prioritize match indications according to a "physical" priority of the entries. A physical priority can be a priority established by a physical location of an entry on a conventional CAM device. Typically, physical priority can correspond to an address of an entry, with a lower address value having priority over a higher address value.

In the example of FIG. 9, a priority encoder 904 can encode a highest priority match indication into an index value INDEX. In some conventional approaches, an index value can be used to access associated data, or alternatively, a highest priority match indication can access associated data directly.

In a conventional approach, some entries may be considered "invalid" and thus may be excluded from generating a match indication. Conventionally, invalid entries can be distinguished from valid entries by a valid bit. That is, valid entries may have a valid bit set to one value (e.g., 1), while invalid entries may have a valid bit set to another value (e.g., 0). In a conventional compare operation, a valid bit value of "1" may be applied in combination with a key, thus forcing invalid entries to "not match" a key value.

Use of valid bits can result in the capability of "per entry" granularity. That is, a key value may be applied to each entry, with entries being excluded or included according to all or a portion of a data value stored within an entry.

Examples of conventional CAM systems will now be described.

A first conventional CAM system is shown in FIG. 10 and designated by the general reference character 1000. A conventional CAM system 1000 may include one or more CAM devices, each of which may perform CAM related operations, such as searches, or the like. In the example of FIG. 10, a CAM system 1000 includes "n+1" CAM devices, shown as 1002-0 to 1002-n. A CAM system 1000 may perform operations in response to commands from a requesting device. In FIG. 10, a requesting device is a network processing unit (NPU) 1004.

FIG. 10 shows an example of a bus based CAM system. In a bus based CAM system, CAM devices may be commonly connected to a requesting device and to one another by a common bus. Thus, in FIG. 10 CAM devices (1002-0 to 1002-n) can be commonly connected to each other and to an NPU 1004 by a bus 1006.

A second conventional CAM system is set forth in FIG. 11 and designated by the general reference character 1100. A second conventional CAM system 1100 may include a number of CAM devices (1102-0 to 1102-3) having common connections to a command and data bus 1104, as well as separate common connections to an index or result bus 1106. Optionally, an index or result bus 1106 may be connected to one or more memory devices 1108, such as a static random access memory (SRAM).

In a system like that shown in FIG. 11, a search command may be issued from a host device 1110 on a command and data bus 1104. CAM devices (1102-0 to 1102-3) may process such a command and generate results, which may be output on an index or result bus 1106. Results may be returned to a command issuing host device 1110 by way of a result bus. Optionally, results may be applied to one or more memory devices 1108 to generate associated data that may then be accessed by a host device 1110.

A drawback to conventional systems, like those set forth in FIGS. 10 and 11, can be limited flexibility in how operations may be executed within such systems and/or how data may be arranged within CAM entries of a system. For example, in the case of a search operation, a key value may be applied to all entries of a CAM device. It can be possible to exclude search operations from one or more CAM devices by way of a "chip enable" control signal, or the like. However, the "granularity" of such a search remains on a device-by-device basis with respect to the system, and an entry-by-entry basis with respect to individual devices.

Similarly, search results generated from a search or other operations may have a same granularity. In particular, in FIG. 10, each CAM device (1002-0 to 1002-n) may provide a range of index values or associated data values, where such index and/or associated data values is associated with a single entry. In FIG. 1, a CAM device (1102-0 to 1102-n) can apply output results (e.g., index values) to a given associated data device (e.g., an SRAM 1108).

It would be desirable to provide more variation in the way in which operations, such as search operations, can be executed within a CAM device. In particular, it would be desirable to provide variations in granularity of search and/or other CAM operations.

SUMMARY OF THE INVENTION

The present invention may include a content addressable memory (CAM). Such a CAM may have one or more memory arrays. In addition, a CAM device may include one or more programmable information registers associated with a parameter of at least one portion of the memory array.

According to one aspect of the embodiments, a CAM programmable information register can include a soft-priority value.

According to another aspect of the embodiments, a CAM memory array can include a number of CAM entries. Further, a soft-priority value can determine a priority of CAM entries of at least one portion of the memory array with respect to different portions of the memory array.

According to another aspect of the embodiments, a CAM programmable information register may include memory mapping control parameter.

According to another aspect of the embodiments, a CAM programmable information register can include a programmable information value that controls access to at least one portion of a memory array.

According to another aspect of the embodiments, a CAM programmable information value can includes a value that distinguishes at least one portion of a memory array with respect to different portions of a memory array.

The present invention may also include a CAM device having one or more registers. Such registers may be associated with each of a number of CAM sub-blocks. Registers may store a programmable information value associated with CAM entries of an associated CAM sub-block. Such a programmable information register may not be associated with CAM entries of other CAM sub-blocks.

According to one aspect of the embodiments, each register of a CAM device can store a programmable information value in response to an enable signal. An enable signal may be generated in response to command information. Command information can indicate a function for a CAM device.

According to another aspect of the embodiments, a CAM device may also include a command decoder coupled between a command information input and registers. A command decoder can decode command information into predetermined command signals.

According to another aspect of the embodiments, a CAM device may also include a register address decoder coupled between an address input and registers. A register address decoder can decode address values into address signals.

According to another aspect of the embodiments, a CAM device may also include a soft priority compare circuit coupled to at least two registers. A soft priority compare circuit can compare programmable information values of two or more registers associated with different CAM sub-blocks. Such programmable information values can establish a priority of CAM entries of an associated CAM sub-block with respect to CAM entries of other CAM sub-blocks.

According to another aspect of the embodiments, a CAM device programmable information value can include a memory map value. A memory map value can be applied to one or more memory devices that are different from the CAM device.

According to another aspect of the embodiments, a memory map value can be a base address corresponding to a plurality of entries in one or more memory devices.

According to another aspect of the embodiments, a memory map value can be an entry size that indicates a size for entries of one or more memory devices.

According to another aspect of the embodiments, a memory map value can indicate an operation for one or more memory devices.

The present invention may also include a method for generating data values associated with only a portion of the entries in a CAM device. Such method may include setting a plurality of programmable information values in a CAM device, where each programmable information value can be associated with a different set of CAM entries, and accessing programmable information values in response to an operation of the CAM device.

According to one aspect of the embodiments, an operation according to the above method can include a search operation. In addition, accessing programmable information values can include outputting a programmable information value if associated CAM entries generate a hit indication in response to a search operation.

According to another aspect of the embodiments, a programmable information value according to the above method can include a memory map base address for a memory device different than a CAM device.

According to another aspect of the embodiments, a programmable information value according to the above method can include a memory map entry size for a memory device different than the CAM device.

According to another aspect of the embodiments, a programmable information value according to the above method can include a memory map operation corresponding to a predetermined operation on a memory device different than the CAM device.

According to another aspect of the embodiments, a programmable information value according to the above method can include a target value for controlling access to a corresponding set of CAM entries.

BRIEF DESCRIPTION OF THE DRAWINGS

FIG. 3D is table showing memory map values corresponding to RAM entry sizes according to an embodiment.

FIG. 3E is a table showing memory map values corresponding RAM effects according to an embodiment.

FIG. 4A is a block diagram of a CAM device according to another embodiment.

DETAILED DESCRIPTION OF THE EMBODIMENTS

Various embodiments of the present invention will now be described in conjunction with a number of figures. The embodiments set forth devices and methods for associating programmable information values with different groups of entries in a content addressable memory (CAM) device.

Figure 1A:
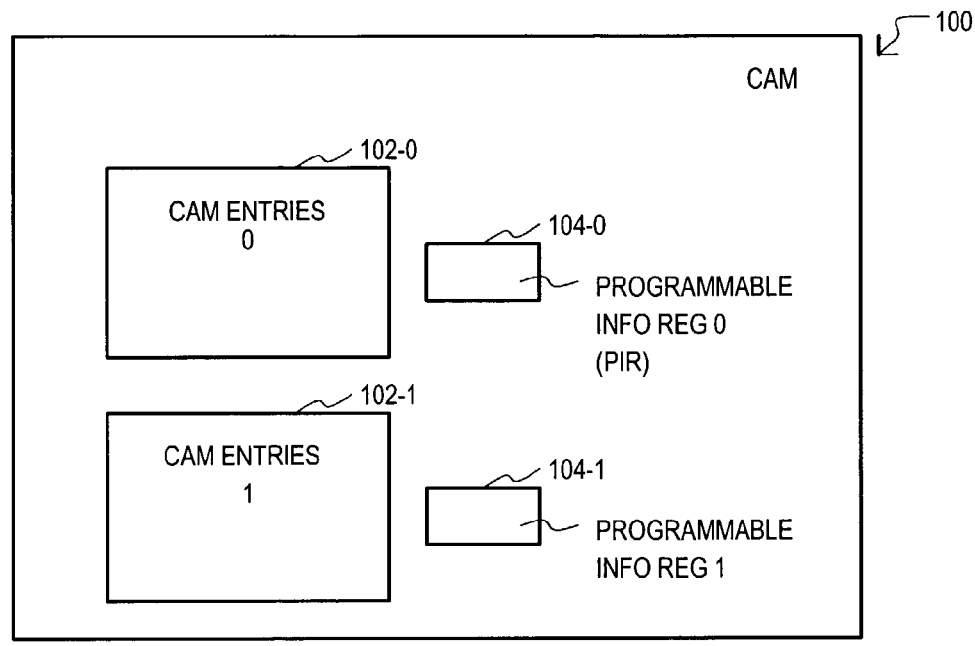
FIG. 1A is a block diagram of a content addressable memory (CAM) device according to one embodiment of the present invention.

Referring now to FIG. 1A, a CAM device according to one embodiment is set forth and designated by a general reference number 100. A CAM device 100 may include a number of entries that may be conceptualized as being arranged into entry sets. Thus, in the arrangement of FIG. 1A, a CAM device 100 may include entry sets 102-0 and 102-1. A CAM device 100 may also include a number of programmable information registers (PIR) 104-0 and 104-1. At least one PIR (104-0 and 104-1) may be associated with each set of entries (102-0 and 102-1). In FIG. 1A, PIR 104-0 can be associated with entry set 102-0 and PIR 104-1 can be associated with entry set 102-1.

In one particular arrangement, CAM entry sets (102-0 and 102-1) can be conceptualized as "sub-blocks" of a CAM device. Such a general structure may be repeated on a higher level with a CAM device including a number of "blocks" that each includes multiple sub-blocks.

CAM entry sets (102-0 and 102-1) may include CAM entries that are logically associated with one another. As but one example, CAM entries of a same CAM entry set (102-0 and 102-1) may be addressable by the same higher order address bits. In addition or alternatively, CAM entries of a same CAM entry set (102-0 and 102-1) can be physically situated next to one another in a CAM device 100.

Preferably, CAM entry sets (102-0 and 102-1) are included in a same CAM device 100. More preferably, CAM entry sets (102-0 and 102-1) are formed in a same semiconductor substrate.

Of course, a CAM device according to the present invention can include more than two entry sets.

As noted above, each PIR (104-0 and 104-1) may be logically associated with a set of CAM entries (102-0 and 102-1). Thus, a value stored within one PIR can affect the operation of, or otherwise correspond to the entries of an associated CAM entry set, but not effect or correspond to non-associated CAM entries. For example, referring to FIG. 1A, a value stored in PIR 104-0 can affect operations related to CAM entry set 102-0, but may not affect operations related to CAM entry set 102-1. Conversely, a value stored in PIR 104-1 can affect operations related to CAM entry set 102-1, yet may not affect operations related to CAM entry set 102-0.

A PIR (104-0 and 104-1) may be accessed by a corresponding register address. In this way, values may be written to, or read from a PIR (104-0 and 104-1). In particular arrangements, values may be written to and/or read from a PIR (104-0 and 104-1) by a configuration command received by a CAM device 100.

Each PIR (104-0 and 104-1) may store at least one programmable information value. In one particular arrangement, programmable information values may include one or all of the following: a soft priority value, a programmed target value and/or a memory map parameter.

A "soft" priority value may be a programmable value that associates a search priority with a corresponding set of entries. Referring still to FIG. 1A, a soft priority value stored in a PIR 104-0 would be associated with CAM entries of CAM entry set 102-0. A soft priority can establish priority from among active match indications generated based on entries of a CAM device. A priority value may be considered "soft," as it may be changeable by a user or other process.

For example, like a conventional CAM, CAM entries of a CAM device 100 may have a per entry "hard" priority established by circuits of the CAM entry sets (102-0 and 102-1). More particularly, each entry may have a different address, and priority among entries may be established by such an address. Even more particularly, entries within CAM entry sets (102-0 and 102-1) may have sequentially increasing addresses. In such a case, all entries of CAM entry set 102-0 could have a higher "hard" priority than all addresses of CAM entry set 102-1, as addresses in CAM entry set 102-0 could all be lower than those of CAM entry set 102-1 (assuming that the lower and address the higher the priority).

However, unlike conventional approaches that may establish priority based on address alone, the present invention can provide a priority according to a programmable information value. For example, assuming a same hard priority as noted above, if a soft priority value for a CAM entry set 102-1 is set to a higher priority than a soft priority of CAM entry set 102-0, a match entry generated within CAM entry set 102-1 can have a higher priority than any entry of CAM entry set 102-0, despite having a higher address.

A programmed target value may control access to and/or operation of an associated set of entries. For example, referring again to FIG. 1A, a CAM device 100 can receive a request to perform an operation that can include an accompanying search target value. If such a search target value matches a programmed target value in a PIR (104-0 and 104-1), a corresponding set of CAM entries (102-0 and 102-1) can be involved in the requested operation. However, if a search target value does not match a programmed target value in a PIR (104-0 and 104-1), a corresponding set of CAM entries (102-0 and 102-1) may be excluded from the requested operation. Excluding a set of CAM entries (102-0 and 102-1) from an operation can include, without limitation, preventing access to such CAM entry sets (102-0 and 102-1) and/or disabling operations with such CAM entry sets (102-0 and 102-1).

A memory map parameter may include a value that can correspond to a particular memory location or locations within a memory device that is different from a CAM device on which PIRs (104-0 and 104-1) are located. Such a memory device may include, for example, a random access type memory (RAM). In one very particular approach, memory map parameter may form a base address for a RAM device. Even more particularly, a memory map parameter may form a base address for a RAM device that can be combined with all or a portion of an index value generated from a CAM entry within a corresponding entry set (102-0 and 102-1). A resulting address value can access associated data within a RAM device.

In this way, entries within a CAM device may be divided into different sections, or sets, each such section having one or more programmable information values associated therewith. Such programmable information values may differentiate operations and/or results between such different sections.

Figure 1B:
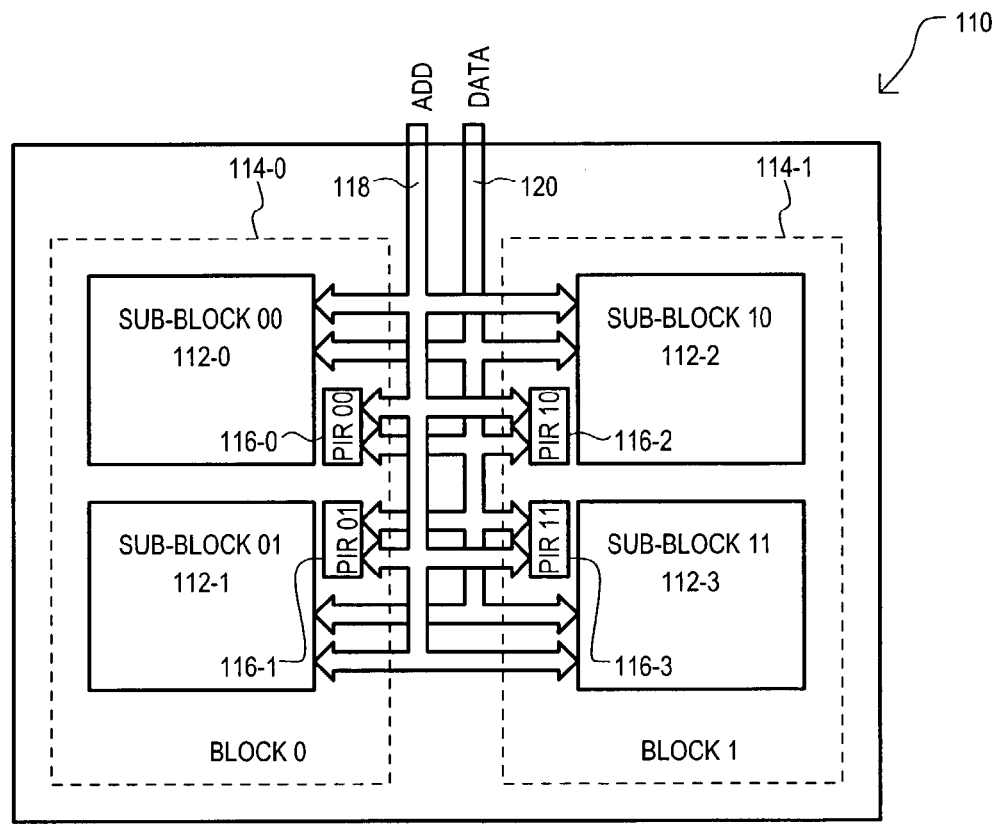
FIG. 1B is a block diagram of a CAM device according to another embodiment of the present invention.

Referring now to FIG. 1B, a CAM device according to another embodiment is set forth and designated by the general reference number 110. A CAM 110 device may include CAM entries arranged into sub-blocks 112-0 to 112-3 that are arranged into blocks 114-0 and 114-1. A CAM 110 can further include PIRs 116-0 to 116-3 corresponding to each sub-block (112-0 to 112-3). As in the case of FIG. 1A, each PIR (116-0 to 116-3) may store one or more programmable values for association with a sub-block (112-0 to 112-3).

Also shown in FIG. 1B are an address bus 118 and a data bus 120. CAM entries within each sub-block (112-0 to 112-3) can be accessed according to address values provided on address bus 118. CAM data for such entries may also be written and read via a data bus 120. In addition, PIRs (116-0 to 116-3) can be accessed according to address values provided on address bus 118. Data for PIRs (116-0 to 116-3) can be written and read via a data bus 120, as well. As is well understood, address range values, and/or control signals can distinguish PIR (116-0 to 116-3) addresses from CAM entry addresses.

Figure 1C:
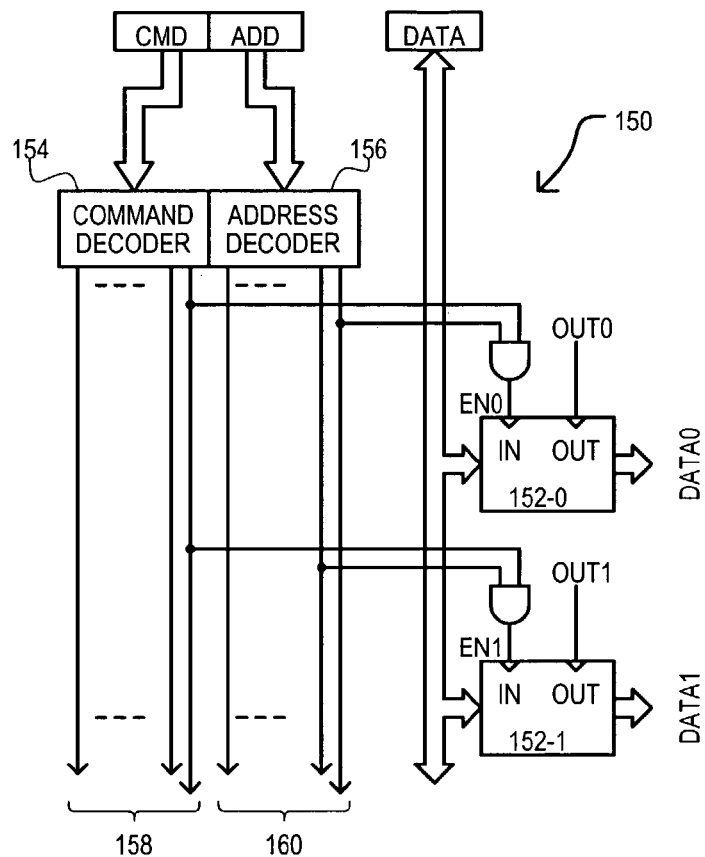
FIG. 1C is a block diagram of a programmable information register (PIR) programming circuit according to one embodiment of the present invention.

Referring now to FIG. 1C, a PIR programming circuit according to one embodiment is set forth and designated by the general reference number 150. A programming circuit 150 may receive command data CMD, address data ADD, and register DATA for storage within PIRs, two of which are shown as 152-0 and 152-1. A programming circuit 150 may include a command decoder 154 and address decoder 156.

A command decoder 154 can decode command data CMD into command signals driven on command lines 158. Similarly, an address decoder 156 can decode address data into address signals driven on address lines 160.

PIRs 152-0 and 152-1 can be accessed according to corresponding enable signals EN0 and EN1, respectively. Enable signals (EN0 and EN1) can be a logical combination of at least one command signal and at least one address signal. In the particular example of FIG. 1C, enable signals EN0 and EN1 can be formed with a logical AND operation between a common command signal and different address signals.

Of course the programming circuit 150 of FIG. 1C is but one example illustrating how data values may be stored in a PIR, and should not be construed as limiting the invention thereto.

In FIG. 1C, data within PIRs 152-0 and 152-1 may be output according to corresponding output signals OUT0 and OUT1, respectively. Output signals (OUT0 and OUT1) may be generated by other circuits as will be described in more detail below. In this way, data values stored in PIRs 152-0 and 152-1 can be output according to signals other than those based on an applied register address.

Figure 2:
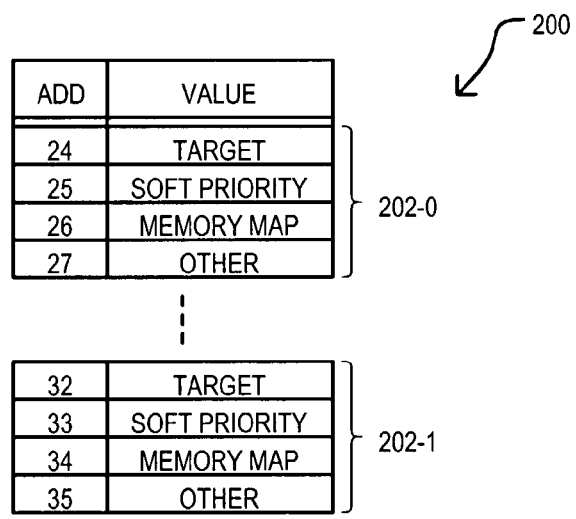
FIG. 2 is block diagram showing examples of PIRs according to one embodiment of the present invention.

Referring now to FIG. 2, an example of a PIR arrangement according to an embodiment is set forth in a block diagram and designated by the general reference character 200. FIG. 2 shows how PIRs can be conceptualized as different portions of a same register address space. In the particular case of FIG. 2, two PIRs are shown 202-0 and 202-1. PIR 202-0 can store values such as those noted above in conjunction with FIG. 1A. In particular, a programmed target value TARGET, a soft priority value SOFT PRIORITY, and/or a memory map value MEMORY MAP can be stored. A PIR (202-0) may also store one or more additional values, one of which is shown as OTHER in FIG. 2.

A PIR 202-0 may include one range of addresses 24–27. Another PIR 202-1, can have the same general arrangement as PIR 202-0, but occupy a different range of addresses 32–35.

Other addressing options may include, as but one example, having block number prefix and an offset, such as registers referring to a block address.

Of course, while address values for multiple registers may preferably be consecutive, the present invention is not limited to such an arrangement. As but one example, in other arrangements it may be desirable to arrange particular value types for multiple registers in a consecutive address space (e.g., all priority values for a group of sub-blocks in one range, etc.).

Figure 3A:
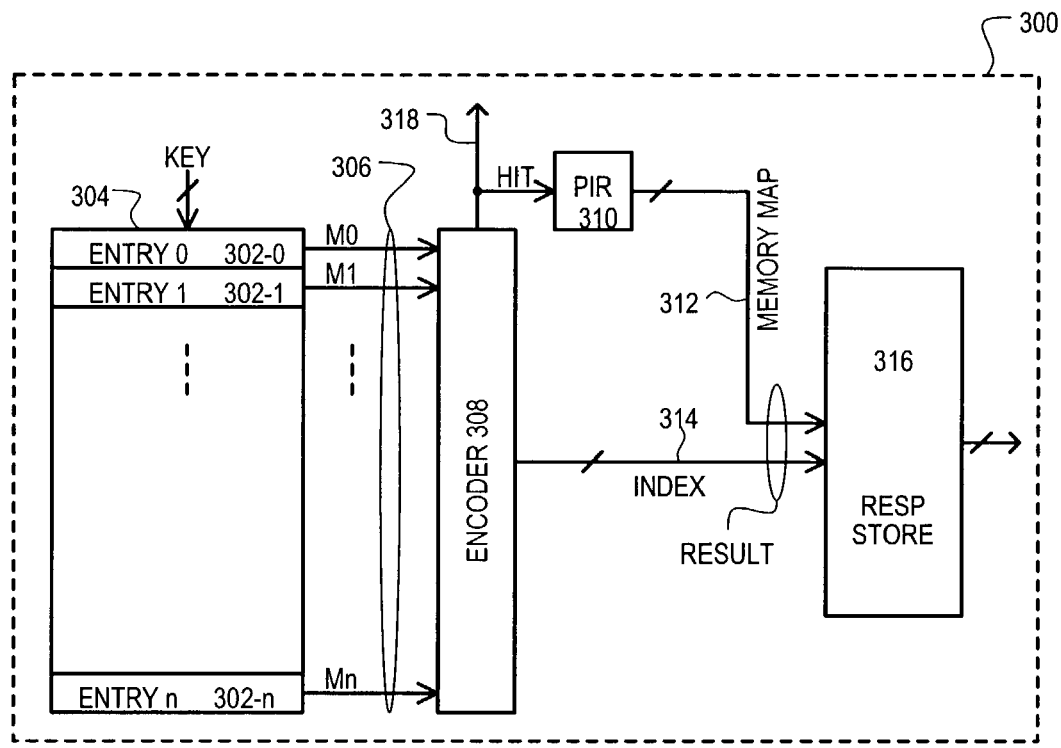
FIG. 3A is a block diagram of a sub-block of a CAM device according to an embodiment of the present invention.

Referring now to FIG. 3A, a sub-block of a CAM device according to one embodiment is set forth and designated by the general reference number 300. A sub-block 300 may include a number of entries 302-0 to 302-$n$ formed from all or a portion of a CAM array 304. A sub-block 300 can also include match lines 306, a priority encoder 308, at least one PIR 310, a PIR output bus 312, an index output bus 314, and an output store 316.

As noted above, a CAM array 304 can include a number of CAM entries (302-0 to 302-$n$). Each CAM entry (302-0 to 302-$n$) may store a data value for comparison with a key value (i.e., a comparand). While CAM entries may take various forms, such entries may preferably include a number of CAM cells, or the like, arranged into one or more arrays. Further, in a search operation, a key value may be applied essentially simultaneously to CAM entries of a sub-block 300.

In response to the application of a key value, a CAM entry (302-0 to 302-$n$) may generate a match indication M0 to Mn on corresponding match lines 306. An active match indication (M0 to Mn) can indicate that a data value stored in a corresponding entry (302-0 to 302-$n$) matches an applied key value. As is well understood to those skilled in the art, such a match determination may result from masked cells or bits (e.g., "ternary" CAM compare) or non-masked cells or bits ("binary" CAM compare), as but two examples.

Match indications (M0 to Mn) can be provided to priority encoder 308 on match lines 306. A priority encoder 308 may prioritize active match indications. In addition, a priority encoder 308 may encode a highest priority active match indication into an index value INDEX. Still further, a priority encoder 308 may activate a hit indication HIT in the event an active match indication (M0–Mn) is generated.

A PIR 310 may store values associated with a sub-block 300. In the example of FIG. 3A, a PIR 310 may store a memory map value MEMORY MAP. A PIR 310 may receive a hit indication HIT by way of a hit indication line 318. In response to an active hit indication HIT, a PIR 310 may output a stored memory map value MEMORY MAP.

Note that a memory map value MEMORY MAP can be made up of a base term and an entry size term, and can be affected by a particular received command. For example a memory map operation may include the following:

memory map base+index*entry size.

A value "memory map base" may be a base term, the term "index" may be an index value corresponding to a matching entry, and the term "entry size" may be an entry size for a memory device.

An output response store 316 may receive a memory map value MEMORY MAP from a PIR 310 on a PIR output bus 312. An output response store 316 may also receive index value INDEX from a priority encoder 308 on an index output bus 314.

In this way, a search result (e.g., a hit indication) may be used to access values stored in a PIR (e.g., memory map values).

Figure 3B:
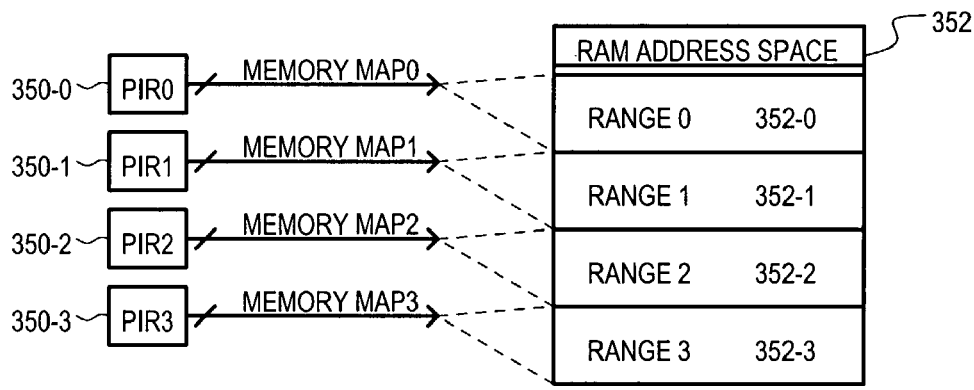
FIG. 3B is a block diagram of an example of memory map values according to an embodiment.

Referring now to FIG. 3B, an example of a particular memory map value for a CAM device is set forth in a block diagram. FIG. 3B shows four PIRs 350-0 to 350-3 that can each provide corresponding memory map values MEMORY MAP0 to MEMORY MAP3, respectively. FIG. 3B also shows a random access memory (RAM) address space 352. A RAM address space 352 may represent a range of address values accessible on one or more RAM devices. In the example of FIG. 3B, each memory map value (MEMORY MAP0 to MEMORY MAP3) can correspond to a different address range (352-0 to 352-3) of a RAM address space 352.

Of course, while FIG. 3B shows address ranges (352-0 to 352-3) that appear equal in size, address ranges (352-0 to 352-3) can differ in size.

Figure 3C:
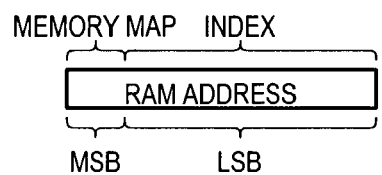
FIG. 3C is a block diagram showing memory map values corresponding to random access memory (RAM) address spaces according to an embodiment.

FIG. 3C shows an example of memory map values that form a portion of a RAM entry address. As shown in FIG. 3C, a memory map value MEMORY MAP may form all or a portion of more significant bits MSB of a RAM address. At the same time, an index value INDEX (such as one generated by a priority encoder) may form all or a portion of less significant bits LSB.

FIG. 3D shows another example of memory map values that correspond to an entry size of a memory device. In the particular example shown, different combinations of a multi-bit memory map value can indicate an entry size.

FIG. 3E shows one approach for having memory map values that correspond to an operation generating a given effect in a memory device. In the particular example shown, four general effects are designated, including "add," "insert," "set" and "clear." An add effect/operation can add a given value to data at one or more locations in a memory device. An insert effect/operation can examine one or more data values stored at a memory device location, and insert a given data value in the event a location stores a predetermined value (e.g., 0). A set effect/operation may perform a logical OR-type operation between a given data value and one or more memory locations. A clear effect/operation may perform a logical AND-type operation between a given data value and one or more memory locations.

It is understood that in a preferred embodiment, a single CAM device may have multiple sub-blocks, each capable of providing a different programmable memory map value in conjunction with an index value. Such an approach may provide more granularity in generating associated data in response to searches, as portions of a CAM device (e.g., sub-blocks) can be associated with different address ranges or devices according to programmable memory map values.

Referring now to FIG. 4A, a CAM device with a number of sub-blocks according to one embodiment is set forth and designated by the general reference number 400. The particular example of FIG. 4A shows two sub-blocks 400-0 and 400-1.

Sub-blocks (400-0 and 400-1) may include some of the same general components as sub-block 300 shown in FIG. 3A. To that extent, like components will be referred to by the same reference character but with the first digit being a "4" instead of a "3."

Accordingly, like sub-block 300 of FIG. 3A, sub-blocks (400-0 and 400-1) may include PIRs 420-0 and 420-1. However, in FIG. 4A, PIRs (420-0 and 420-1) can output soft priority values (SOFT PRIORITY 0 and SOFT PRIORITY 1) on PIR output buses 422-0 and 422-1, instead of memory map values.

FIG. 4A shows an example of a CAM device that may include PIRs with soft priority values that are used to select from among multiple search results.

A CAM device 400 may further include a soft priority compare circuit 424. A soft priority compare circuit 424 may receive two or more index values (INDEX0 and INDEX1) from different sub-blocks (400-0 and 400-1). In addition, a soft priority compare circuit 424 may also receive soft priority values (SOFT PRIORITY 0 and SOFT PRIORITY 1) corresponding to such index values (INDEX0 and INDEX1). According to which soft priority value is of higher priority, a soft priority compare circuit 424 can output a corresponding index value. In the event additional comparison to other sub-block index results is performed, a soft priority compare circuit 424 can output both a soft priority value and a corresponding index value.

Note also, that if soft priority values are equal, further compares between two index values may be performed and the higher precedence index value of the two may be output.

For example, in the example of FIG. 4A, it will be assumed that the application of a key value KEY results in sub-block 400-0 generating index value INDEX0 and outputting soft priority value SOFT PRIORITY 0. In response to the same key value, sub-block 400-1 can generate index value INDEX1 and output soft priority value SOFT PRIORITY 1. If SOFT PRIORITY 0 is of higher precedence than SOFT PRIORITY 1, a soft priority compare circuit 424 may output index value INDEX 0 as a "winning" index value INDEX x on index result bus 426. In addition, soft priority compare circuit 424 may output SOFT PRIORITY VALUE 0 on priority result output bus 428.

In this way, priority between index values generated by different sub-blocks may be output according to a programmable value associated with such sub-block, rather than solely upon a "hard" priority established by physical address, or the like. Such an approach may provide more granularity in search operations, as portions of a CAM device (e.g., sub-blocks) may be programmed to have higher priorities, regardless of physical location and/or arrangement within a device.

Figure 4B:
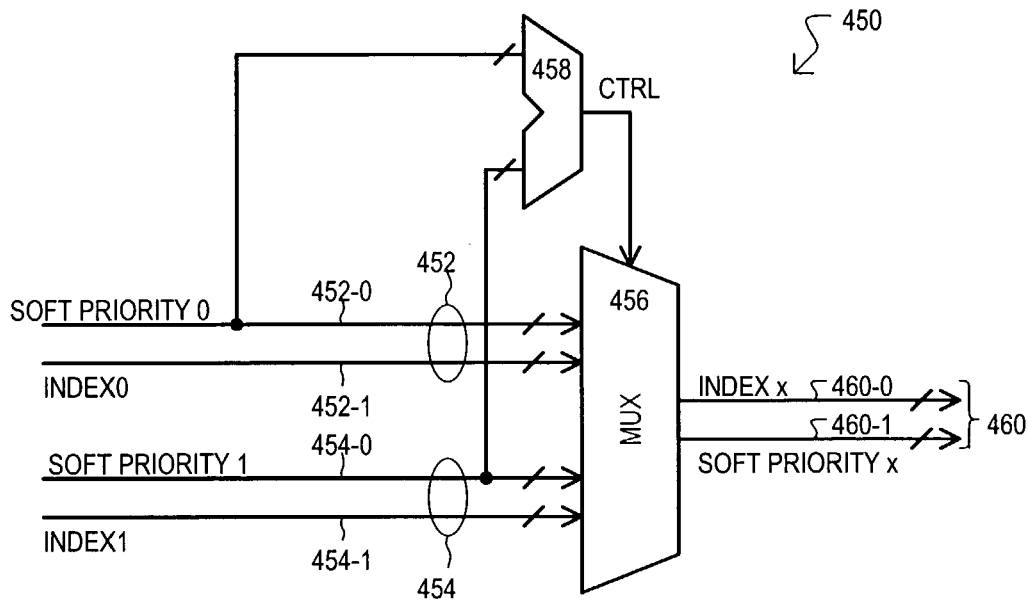
FIG. 4B is a block diagram of a soft priority compare circuit according to one embodiment of the present invention.

Referring now to FIG. 4B, a soft priority compare circuit according to one embodiment is set forth and designated by the general reference number 450. A soft priority compare circuit 450 may include inputs 452 and 454, a multiplexer (MUX) 456, a comparator circuit 458, and an output 460.

The particular soft priority compare circuit 450 of FIG. 4B includes an input 452 that may receive one soft-priority value/index pair SOFT PRIORITY0/INDEX0, and another input 454 that may receive another soft-priority value/index pair SOFT PRIORITY1/INDEX1. More particularly, one soft priority value SOFT PRIORITY0 may be received on input lines 452-0 while a corresponding index value INDEX0 may be received on input lines 452-1. Similarly, another soft priority value SOFT PRIORITY1 may be received on input lines 454-0 while a corresponding index value INDEX1 may be received on input lines 454-1.

A MUX 456 may selectively provide values received at one input (452 or 454) on an output 460. In the arrangement of FIG. 4B, operation of a MUX 456 may be controlled according to a control signal CTRL generated by comparator circuit 458. In particular embodiments, a MUX 456 may be a conventional multi-bit MUX circuit.

A comparator circuit 458 may receive one soft priority value (e.g., SOFT PRIORITY0) at one input and another soft priority value (e.g., SOFT PRIORITY1) at another input. Accordingly to a comparison between such input values, a comparator circuit 458 may generate a control signal CTRL. More particularly, a comparator circuit 458 may generate a control signal CTRL according to which soft priority value (e.g., SOFT PRIORITY0 or SOFT PRIORITY1) has a higher priority. As is well understood, such a comparison can be based on magnitude. For example, a lower magnitude may represent a higher priority, or vice versa. Further, "ties" in a priority value may be settled by predetermined criteria, for example, the precedence of the index values. In this way, a particular input (452 or 454) may be selected by further comparison when two soft priority values have a same priority. In particular embodiments, a comparator circuit 458 may be a conventional multi-bit binary comparator circuit.

The particular soft priority compare circuit 450 of FIG. 4B includes an output 460 that may output a "winning" soft priority value/index pair SOFT PRIORITY x/INDEX x. As shown, a winning soft priority value SOFT PRIORITY x may be provided on output lines 460-0 while a corresponding index value INDEX1 may be output on output lines 460-1. A winning soft priority value/index pair may be that pair having a highest priority from among multiple such pairs received by a soft priority compare circuit 450.

In this way, a soft priority compare circuit may output a "winning" soft-priority value/index pair SOFT PRIORITY x/INDEX x from multiple such pairs.

It is understood that compare operations, like that shown in FIG. 4B, may be carried out in a hierarchical fashion with respect to various sections of a CAM device. One example of such an arrangement is shown in FIG. 4C.

Figure 4C:
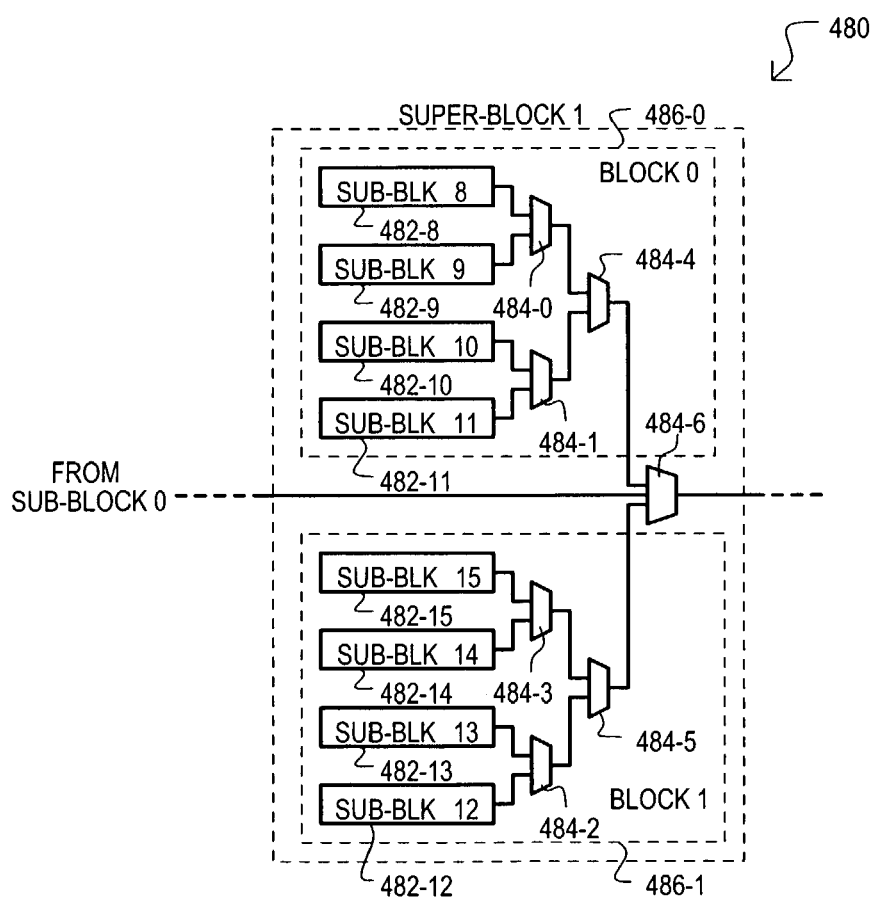
FIG. 4C is a block schematic diagram of a CAM device having a hierarchical comparison arrangement according to one embodiment of the present invention.

FIG. 4C shows a portion CAM device 480 that may include CAM entries arranged into sub-blocks 482-8 to 482-15. Determination of priority from among results two sub-blocks may be determined by first level compare circuits 484-0 to 484-3. Thus, first level compare circuits 484-0 to 484-3 may each provide a "first level" winning result from among entries of two sub-blocks. Second level compare circuits 484-4 and 484-5 may determine priority from among two first level sub-blocks.

Results from second level compare circuits 484-4 and 484-5 may be considered a winning "block" result. A block 486-0 and 486-1 can include four sub-blocks, and thus represent a higher level in an overall CAM hierarchy.

As further shown in FIG. 4C, an even higher level in a hierarchy can be provided by third level compare circuit 484-6. Third level compare circuit 484-6 may determine a priority from among the results of two blocks 486-0 and 486-1 and a "super-block" result (shown as "FROM SUB-BLOCK 0") in FIG. 4C. A super-block result FROM SUB-BLOCK 0 can be winning result from two or more other blocks. An output from a third level compare circuit 484-6 may be considered a super-block result.

In this way, the various compare circuits and methods may be implemented to generate priority results in a hierarchical fashion (e.g., sub-block results, block results, and super-block results).

Figure 5A:
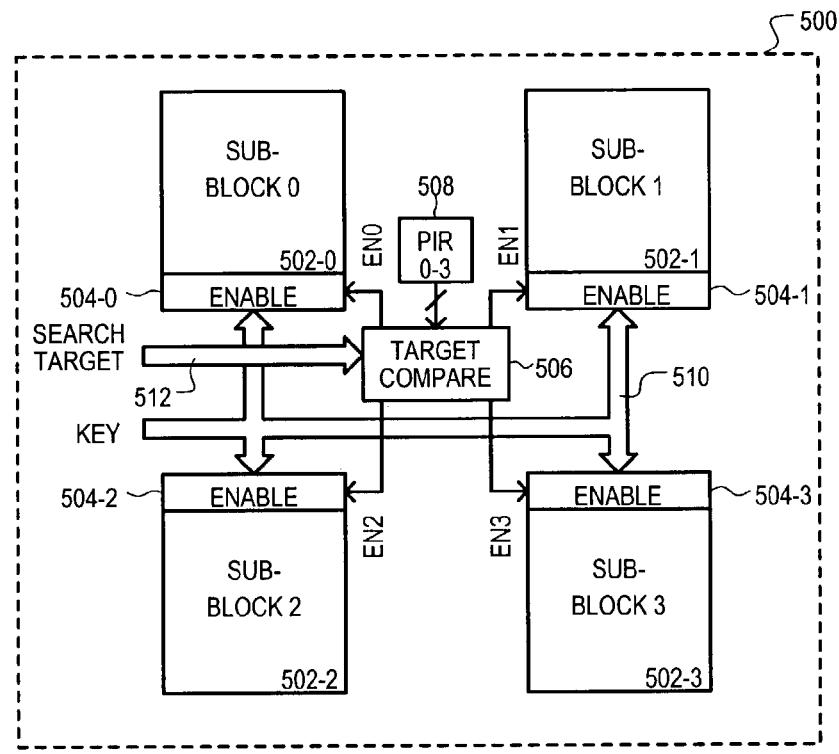
FIG. 5A is a block diagram of a CAM device including a central compare circuit according to one embodiment of the present invention.

Referring now to FIG. 5A, a CAM device with a number of sub-blocks according to another embodiment is set forth and designated by the general reference number 500. A CAM device 500 may include a number of sub-blocks 502-0 to 502-3, enable circuits 504-0 to 504-3, a common target compare circuit 506, PIRs 508, a key input 510, and a search target input 512.

Sub-blocks (502-0 to 502-3) may perform a search operation by comparing a received key value to data values stored in a number of CAM entries. In addition, operations within sub-blocks (502-0 to 502-3) may be enabled or disabled according to corresponding enable circuits (504-0 to 504-3).

Enable circuits 504-0 to 504-3 may enable or disable operations in corresponding sub-blocks 502-0 to 502-3, respectively. Each enable circuit (504-0 to 504-3) may operate in response to a corresponding enable signal (EN0 to EN3) generated by a common target compare circuit 506. Enable circuits (504-0 to 504-3) may enable or disable sub-blocks according to various means. As but two examples, access to a sub-block can be restricted (e.g., key may be prevented from being applied) or the ability of CAM entries to generate output values may be restricted (e.g., precharging and/or discharging of nodes may be prevented, index values may be prevented from being output).

It is noted that such a selective disabling may reduce power consumption in a CAM device over conventional devices that may activate all sections in a compare operation.

CAM sub-block operations that may be restricted according to a comparison between programmable target values associated with a CAM sub-block and an applied search target value may include, without limitation, search operations that compare a key against entry values; write operations that write data to a CAM entry or register; read operations that read data from a CAM entry or CAM register; "learn" operations that can write a key value into a particular or next available CAM entry location; and parity check operations that may check the parity of all or a portion of a CAM entry or CAM register with a corresponding parity bit.

A common target compare circuit 506 may receive a search target value from search target input 512 as well as programmed target values from PIRs 508. A search target input 512 may receive a search target value received with a request or the like, thereby dictating a possible limitation on which particular sub-blocks an operation may be performed upon. In the example of FIG. 5A, PIRs 508 may provide programmed target values for each sub-block (502-0 to 502-3) to a common target compare circuit 506. Within a common target compare circuit 506, such programmed target values may be compared to a given search target value. Such comparison results may be output as enable signals (EN0 to EN3). More particularly, if a programmed target value for sub-block 502-0 matches a search target value, an enable signal EN0 can be active. However, if a programmed target value for sub-block 502-1 does not match a search target value, an enable signal EN1 can be inactive.

FIG. 5A shows a CAM device 500 that may include a "common" target compare circuit 506. A common target compare circuit 506 may compare multiple programmable target values to a search target value at a common location. Thus, a common target compare circuit 506 may include comparator circuits that are closer to one another than to corresponding sub-blocks (502-0 to 502-3). Accordingly, FIG. 5A may also represent a top plan view of a CAM device 500.

Figure 5B:
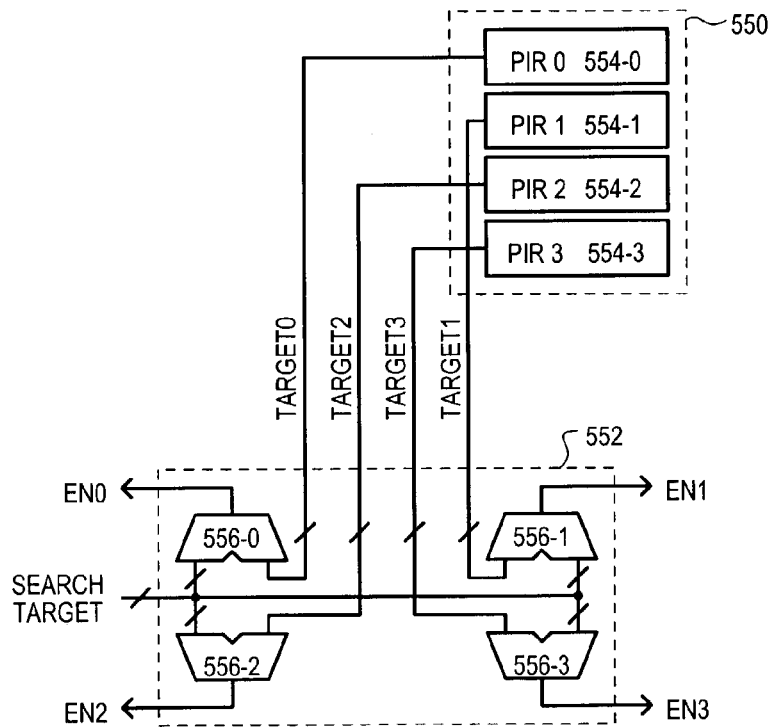
FIG. 5B is a block schematic diagram of a central compare circuit.

One very particular example of a common target compare circuit and corresponding PIRs is shown in FIG. 5B. FIG. 5B includes PIRs 550 and common compare circuit 552. PIRs 550 may include a number of PIRs (554-0 to 554-3), each of which may provide at least one programmable target value TARGET0 to TARGET3. It is understood that programmable target values (TARGET0 to TARGET3) may each correspond to a sub-block.

A common compare circuit 552 may include a number of comparator circuits 556-0 to 556-3. Each comparator circuit (556-0 to 556-3) may include one input that receives a target value (TARGET0 to TARGET3) and another input that receives a search target value SEARCH TARGET. Each comparator circuit (556-0 to 556-3) may also provide a corresponding enable signal that can vary according to a comparison between a received programmable target value (TARGET0 to TARGET3) and a search target value (SEARCH TARGET). For example, if a target value TARGET0 matches a search target value SEARCH TARGET, an enable signal EN0 may be active. However, if a target value TARGET1 does not match a search target value SEARCH TARGET, an enable signal EN1 may be inactive.

Figure 5C:
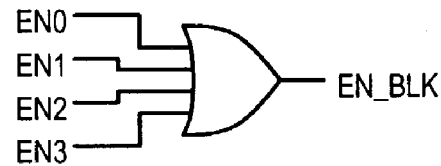

While comparator circuits 556-0 to 556-3 may provide individual enable signals EN0 to EN3, it is understood that all or a portion of such multiple signals may be combined to generate an overall higher-level enable signal. In particular, referring to FIG. 5C, enable signals EN0 to EN3 may be combined to generate a block enable signal EN_BLK. If reference is made back to FIG. 4C, a block enable signal EN_BLK may enable all sub-blocks of a block.

Figure 6A:
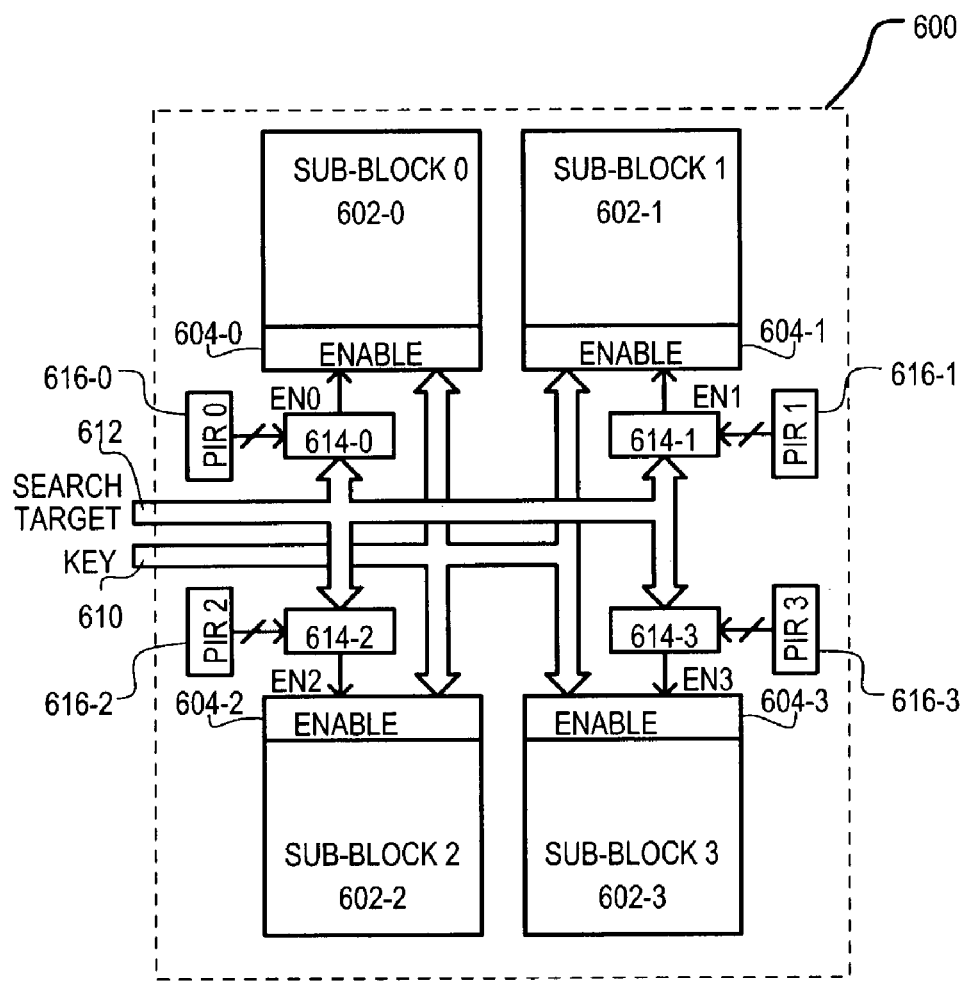
FIG. 6A is a block diagram of a CAM device including a multiple local compare circuits for each sub-block according to one embodiment of the present invention.

Referring now to FIG. 6A, a CAM device with a number of sub-blocks according to another embodiment is set forth and designated by the general reference number 600. A CAM device 600 may include many of the same general constituents as that set forth in FIG. 5A. To that extent, like sections will be referred by the same reference character, but with a first digit being a "6" instead of a "5."

Unlike FIG. 5A, the CAM 600 of FIG. 6A may include "local" comparator circuits 614-0 to 614-3, as opposed to a common comparator circuit like that shown as item 606 in FIG. 5A. A local comparator circuit (614-0 to 614-3) may compare one or more programmable target values for a corresponding sub-block (602-0 to 602-3). In FIG. 6A, local comparators 614-0 to 614-3 compare programmable target values for sub-blocks 602-0 to 602-3, respectively. Further, FIG. 6A shows a case where comparator circuits may be physically closer to corresponding sub-blocks (602-0 to 602-3) than to one another.

FIG. 6A also shows PIRs 616-0 to 616-3, which may provide programmable target values to local comparators 614-0 to 614-3. PIRs (616-0 to 616-3) may also be "local" in that such registers may be physically closer to corresponding sub-blocks (602-0 to 602-3) than to one another.

Figure 6B:
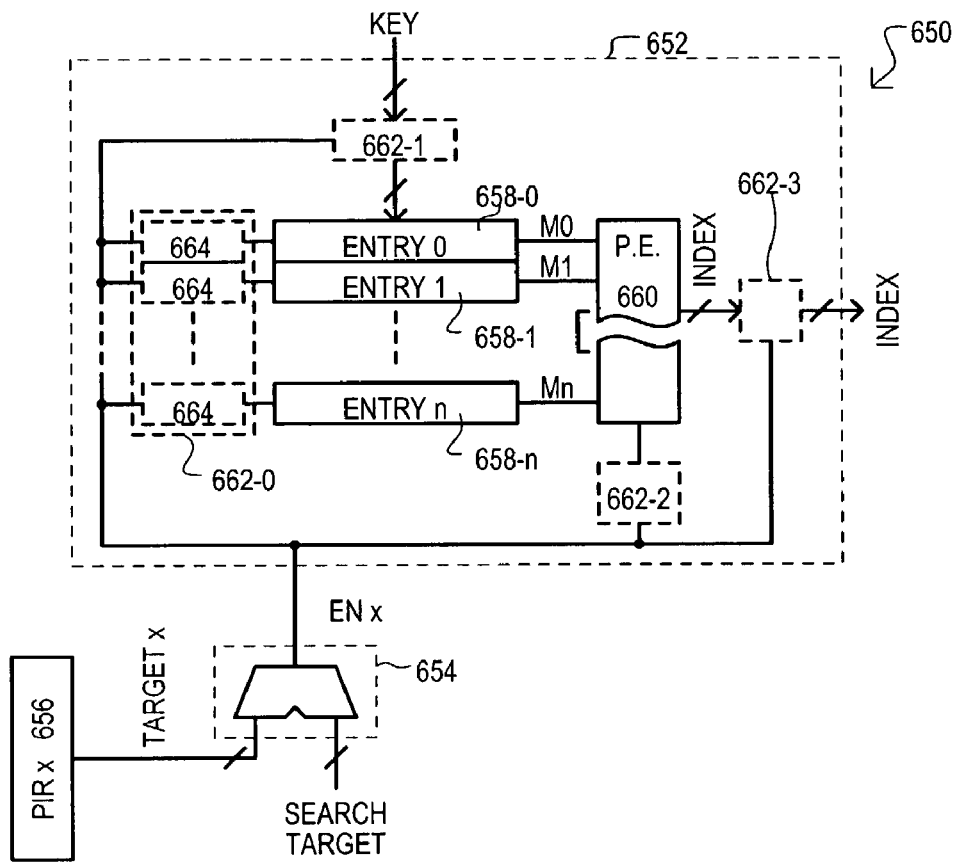
FIG. 6B is a block diagram of an enable circuit according to an embodiment.

One very particular example of a portion of a CAM device having a local comparator circuit is set forth in FIG. 6B and designated by the general reference character 650. A CAM device portion 650 may include a sub-block with enabling circuits 652, a local comparator 654, and a PIR 656.

A sub-block with enabling circuit 652 may include a number of CAM entries 658-0 to 658-n and a priority encoder 660. CAM entries 658-0 to 658-n can store data values for comparison with a key value KEY. Compare results from CAM entries (658-0 to 658-n) may be provided as match indications M0 to Mn. A priority encoder 660 may generate an index value for a highest priority match indication.

Also shown in FIG. 6B are various examples of enable circuits 662-0 to 662-3. It is understood that a CAM device portion 650 may include one or more such enable circuits (662-0 to 662-3). For this reason, such enable circuits (662-0 to 662-3) are shown by dashed lines.

An enable circuit (662-0 to 662-3) may enable or disable a particular portion of a sub-block according to an enable signal EN x. Enable circuit 662-0 shows an enable circuit that may enable/disable CAM entries (658-0 to 658-n). In the example of FIG. 6B 662-0, an enable circuit 662-0 may include a number of entry enable sub-circuits 664. Each entry enable sub-circuit 664 may disable a corresponding CAM entry (658-0 to 658-n) when enable signal EN x is inactive. As but two possible examples, an entry enable sub-circuit 664 may force an entry to a mismatch state or prevent an entry from being precharged (e.g., prevent a match line precharge) when an enable signal EN x is inactive. When an enable signal EN x is active, CAM entries (658-0 to 658-n) may function in a conventional fashion.

Enable circuit 662-1 shows an enable circuit that may allow/prevent a key value KEY from being applied to CAM entries (658-0 to 658-n). As but one of the many possible examples, an enable circuit 662-1 may be a gate circuit that prevents a key value from being driven on comparand lines, or the like. Thus, when an enable signal EN x is active, such an enable circuit 662-1 gate may be "open" allowing a key value KEY to be applied to CAM entries (658-0 to 658-n). However, when an enable signal EN x is inactive, such an enable circuit 662-1 gate may be "closed" preventing a key value KEY from being applied to CAM entries (658-0 to 658-n). In addition, or alternatively, an enable circuit 662-1 may maintain lines that apply a key value (i.e., comparand lines) at a precharge value, or another state that prevents a generation of active match indications.

Enable circuit 662-2 shows an enable circuit that may allow/prevent a priority encoder 660 from generating an index value INDEX. As but one of the many possible examples, an enable circuit 662-2 may force a priority encoder 660 to output an invalid INDEX value (i.e., an index value that does not correspond to a CAM entry).

Enable circuit 662-3 shows an enable circuit that may allow/prevent an index value INDEX from being output from a sub-block. As but one of the many possible examples, an enable circuit 662-3 may be a gate circuit that prevents an index value INDEX being driven on index lines, or the like.

Of course, the various enable circuits described are but exemplary, and should not be construed as limiting the invention thereto.

A local compare circuit 654 may include a comparator that receives a target value TARGET x and another input that receives a search target value SEARCH TARGET. According to a comparison between the two values, an enable signal EN x may be placed to an active state or inactive state.

Of course, while a preferred embodiment may include local compare circuits that generate indications when a search target value matches a target value, compare circuits may provide other types of compare results (e.g., less than, equal to or less than, equal to or greater than, greater than, selected bit comparison, etc.).

While the present invention may include CAM devices, structures and/or features for such a device, the present invention may also include a method for generating data values in a CAM device, where such data values are associated with only a portion of the entries on a CAM device.

Figure 7:
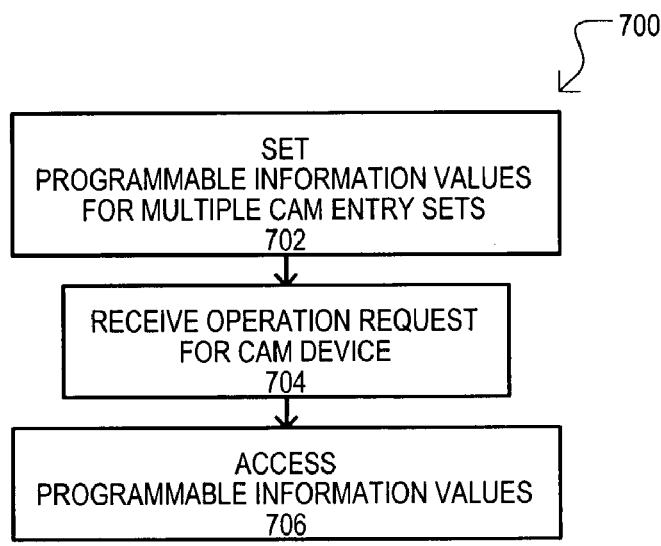
FIG. 7 is a flow diagram of a CAM method according to an embodiment.

Referring now to FIG. 7, a method according to one embodiment is set forth in FIG. 7 and designated by the general reference character 700. A method 700 may include setting programmable information values for multiple CAM entry sets (step 702). A step 702 may include writing programmable information values to predetermined registers within a CAM device. As but two of the many possible alternative approaches, a step 702 may include activating a predetermined set of control lines and/or "resetting" such values in a CAM device. In the latter case, a CAM device may have conventional reset circuits that set predetermined values in registers upon a reset condition, or the like.

A method 700 may also include receiving an operation request for a CAM device (step 704). A step 704 may include receiving command information for a CAM device, more particularly receiving a command code for a CAM device, even more particularly receiving a command code as a predetermined data field in a request packet. As noted above, commands may include, without limitation, a read command, write command, search command, learn command, and/or parity check command.

In the method of FIG. 7, following a reception of an operation request, programmable information values may be accessed (step 706). Accessing programmable information values can include outputting programmable information values to predetermined data paths and/or circuits. More particularly, a step 706 may include outputting data values to a sub-block result data path and/or to compare circuits. Even more particularly, a step 706 may include outputting target programmable information values to compare circuit. In addition or alternatively, a step 706 may include outputting priority and/or memory map values to a result data path.

In this way, a method 700 may access programmable information values for CAM entry sets, and not for an entire CAM device, or for only individual CAM entries.

Figure 8:
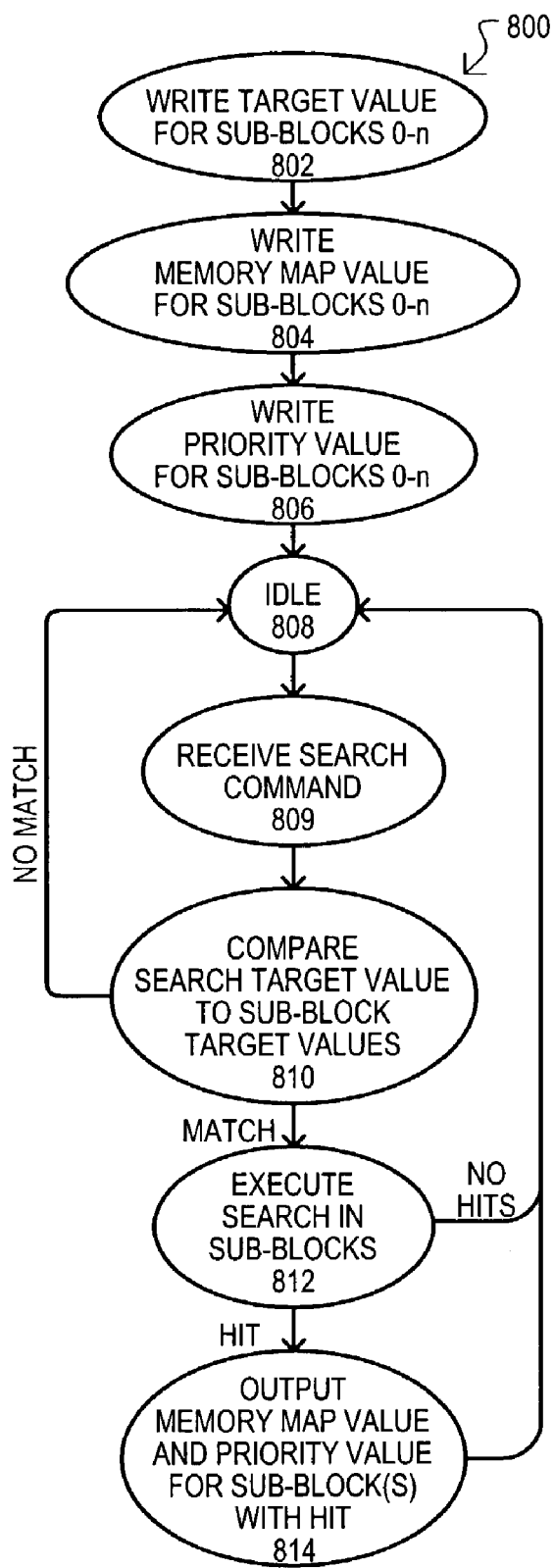
FIG. 8 is a state diagram of a CAM device/method according to another embodiment.
Figure 9:
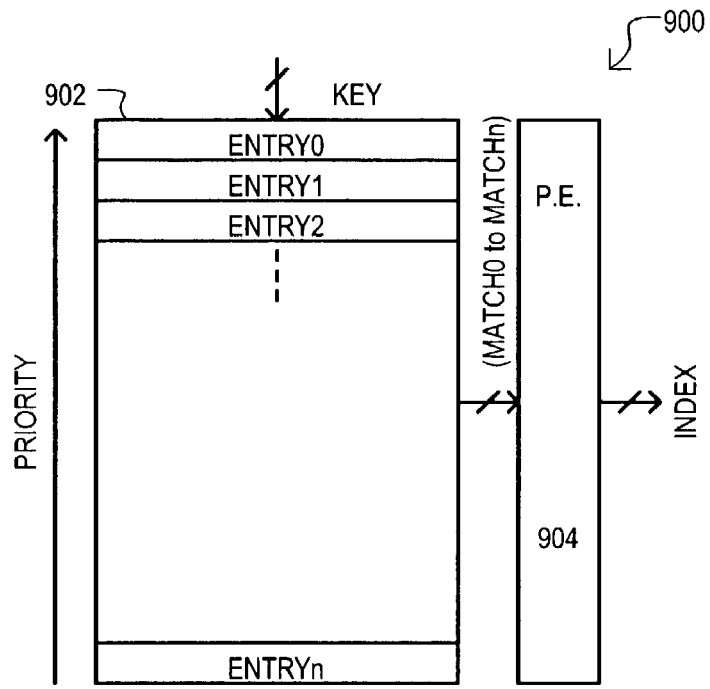
FIG. 9 is a block schematic diagram of a conventional CAM device.
Figure 10:
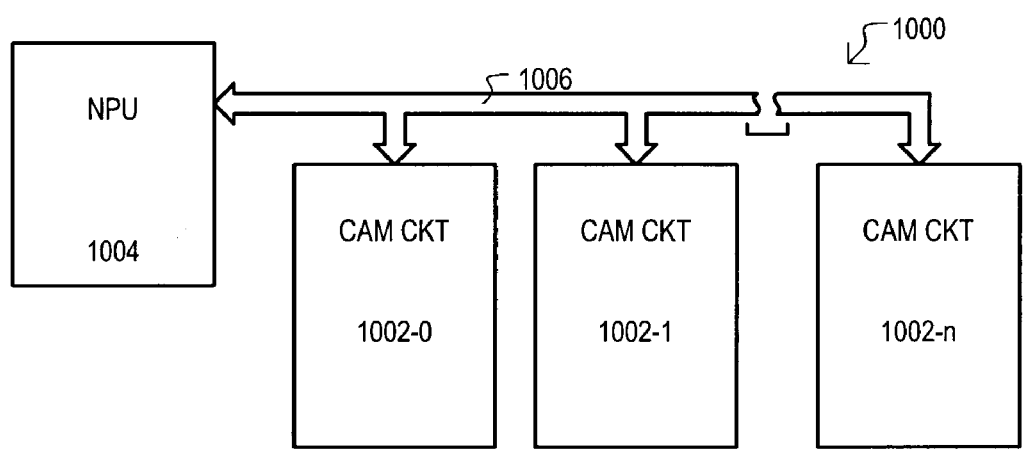
FIG. 10 is a block diagram of a first conventional CAM system.
Figure 11:
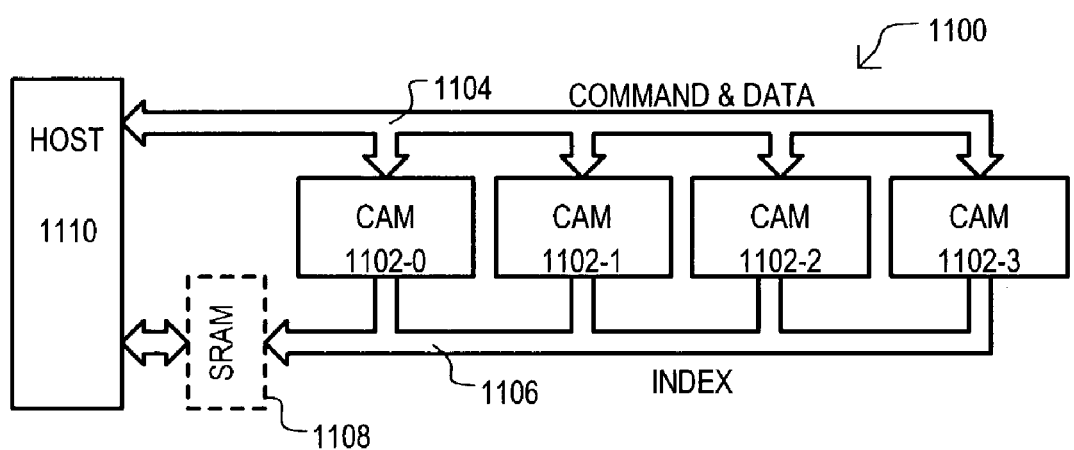
FIG. 11 is a block diagram of a second conventional CAM system.

Referring now to FIG. 8, one example of a CAM device operation according to an embodiment is set forth in a state diagram and designated by the general reference character 800. A device/method according to the present invention may include writing particular values for multiple sub-blocks. In the very particular example of FIG. 8, three such states are shown for sub-blocks 0–n: writing target values 802, writing memory map values 804, and writing priority values 806. It is understood that sub-blocks may each include a number of CAM entries.

Once target values, memory map values, and priority values are received for each sub-block, a CAM device may be ready to execute a received command, and thus may enter an idle state 808.

A CAM device/method 800 may leave an idle state in response to a received command (state 809). FIG. 8 shows the reception of one very particular command: a search command. Of course, though not shown in FIG. 8, in a CAM device/method according to FIG. 8, various other commands could be received including but not limited to: reads, writes, learns and/or parity checks.

Upon receiving a search command, a CAM device/method 800 may compare a search target value to sub-block target values 810. A state 810 may include extracting a search target value from a received command, and comparing the search target value to multiple sub-block target values.

In the event a search target value matches a sub-block target value MATCH, a search may be executed in a corresponding sub-blocks 812. A state 812 may include applying a search key value to CAM entries of sub-blocks to generate a search result. In the particular case of FIG. 8, a search state may result in a hit (e.g., a key matches a valid CAM entry in the sub-block) or a search miss (e.g., a key does not match any valid CAM entries in the sub-block).

In the case of a hit result HIT, a memory map value and priority value for the sub-block or sub-blocks in which a hit result occurs may be output 814.

While the present invention has described parallel access of multiple sub-blocks, it is understood that sub-block comparisons with search target values and/or the output of associated features (e.g., memory map and/or priority values) may be sequentially executed.

Thus, while the embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A content addressable memory (CAM), comprising:
at least one memory array that includes a plurality of CAM entries; and
at least one programmable information register associated with a parameter of at least one portion of the memory array, the at least one programmable information register including a soft-priority value that determines a priority of CAM entries of the at least one portion of the memory array with respect to different portions of the memory array and a target value that controls access to the at least on portion of the memory array.

2. The content addressable memory of claim 1, wherein:
the at least one programmable information register includes a memory mapping control parameter.

3. The content addressable memory of claim 1, wherein:
the programmable information value includes a value that distinguishes the at least one portion of the memory array with respect to different portions of the memory array.

4. A content addressable memory (CAM) device, comprising:
at least one register associated with a different one of a plurality of CAM blocks for storing a programmable information value associated with CAM entries of the associated CAM block, and not associated with the CAM entries of the other CAM blocks of the plurality of CAM blocks; and
a soft priority compare circuit coupled to at least two registers and coupled to receive an index value corresponding to the associated CAM block, the soft priority compare circuit comparing the programmable information values of the at least two registers associated with different CAM sub-blocks and outputting the programmable information value having a highest priority with the index value of the associated CAM block.

5. The CAM device of claim 4, wherein:
each of the registers stores a programmable information value in response to predetermined information from a command received by the CAM device.

6. The CAM device of claim 5, further including:
a command decoder, coupled between a command information input and the registers, that decodes the command information into predetermined command signals.

7. The CAM device of claim 3, further including:
a register address decoder, coupled between an address input and the registers, that decodes address values into address signals.

8. The CAM device of claim 4, further including:
each programmable information value establishes a priority of the CAM entries of the associated CAM sub-block with respect to CAM entries of other CAM sub-blocks, each CAM sub-block being a portion of a CAM block; and
an encoder corresponding to each CAM sub-block, each encoder generating an index value corresponding to each CAM entry of the CAM sub-block.

9. The CAM device of claim 4, wherein:
the programmable information value includes a memory map value for application to at least one memory device different from the CAM device.

10. The CAM device of claim 9, wherein:
the memory map value includes a base address corresponding to a plurality of entries in the at least one memory device.

11. The CAM device of claim 9, wherein:
the memory map value includes an entry size that indicates a size for entries of the at least one memory device.

12. The CAM device of claim 9, wherein:
the memory map value includes an operation value that indicates an operation for the at least one memory device.

13. A method for generating data values associated with only a portion of the entries in a content addressable memory (CAM) device, comprising the steps of:
setting a plurality of programmable information values in a CAM device, each programmable information value being associated with a different set of CAM entries of the CAM device; and
accessing the programmable information values in response to at least one operation of the CAM device, the accessing including outputting a programmable information value and index value if the associated CAM entries generate a hit indication in response to a search operation, the index value corresponding to a highest priority CAM entry generating a hit indication.

14. The method of claim 13, wherein:
the programmable information value includes a memory map base address for a memory device different than the CAM device.

15. The method of claim 13, wherein:
the programmable information value includes a memory map entry size for a memory device different than the CAM device.

16. The method of claim 13, wherein:
the programmable information value includes a memory map operation corresponding to a predetermined operation on a memory device different than the CAM device.

17. The method of claim 13, further including:
the programmable information value includes a target value for controlling access to the corresponding set of CAM entries.

18. The method of claim 13, further including:
at least one of the programmable information values includes a priority value; and
comparing at least two priority values to establish priority between the associated sets of CAM entries.

19. The method of claim 18, wherein:
comparing at least two priority values includes
comparing priority values for at least four sets of CAM entries to generate at least two first level priority results, and
comparing the at least two first level priority results to generate a second level priority result that represents a highest priority from among the four sets of CAM entries.

* * * * *